(12) United States Patent
Gu et al.

(10) Patent No.: US 12,046,590 B2
(45) Date of Patent: Jul. 23, 2024

(54) PIXEL STRUCTURE, DISPLAY PANEL, AND DISPLAY DEVICE

(71) Applicants: BOE MLED Technology Co., Ltd., Beijing (CN); BOE Technology Group Co., Ltd., Beijing (CN)

(72) Inventors: Qibing Gu, Beijing (CN); Guofeng Hu, Beijing (CN); Xiurong Wang, Beijing (CN); Jing Xue, Beijing (CN); Lingyun Shi, Beijing (CN); Ming Chen, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 470 days.

(21) Appl. No.: 17/422,750

(22) PCT Filed: Jan. 28, 2021

(86) PCT No.: PCT/CN2021/074224
§ 371 (c)(1),
(2) Date: Jul. 14, 2021

(87) PCT Pub. No.: WO2021/179833
PCT Pub. Date: Sep. 16, 2021

(65) Prior Publication Data
US 2022/0302093 A1    Sep. 22, 2022

(30) Foreign Application Priority Data
Mar. 11, 2020  (CN) .......................... 202010167215.8

(51) Int. Cl.
G09G 3/32 (2016.01)
H01L 25/16 (2023.01)

(52) U.S. Cl.
CPC ............. *H01L 25/167* (2013.01); *G09G 3/32* (2013.01); *G09G 2300/0452* (2013.01)

(58) Field of Classification Search
None
See application file for complete search history.

(56) References Cited

U.S. PATENT DOCUMENTS

2005/0140604 A1    6/2005  Shin
2006/0114190 A1*   6/2006  Fang .................... G09G 3/3233
                                                345/76

(Continued)

FOREIGN PATENT DOCUMENTS

CN        1622176 A    6/2005
CN      103257494 A    8/2013

(Continued)

OTHER PUBLICATIONS

English translation of CN109061973 (Year: 2018).*

(Continued)

*Primary Examiner* — Xiaoming Liu
(74) *Attorney, Agent, or Firm* — Ling Wu; Stephen Yang; Ling and Yang Intellectual Property (57) ABSTRACT

Provided is a pixel structure, a display panel, and a display device. The pixel structure includes three sub-pixel units of different colors and a driving unit. The three sub-pixel units include a first sub-pixel unit, a second sub-pixel unit, and a third sub-pixel unit. The driving unit is configured to send corresponding display data to the three sub-pixel units respectively. The sub-pixel units are arranged on one side or two sides of the driving unit.

3 Claims, 8 Drawing Sheets

(56) References Cited

U.S. PATENT DOCUMENTS

| | | | |
|---|---|---|---|
| 2010/0207852 A1* | 8/2010 | Cok | H10K 59/129 345/83 |
| 2015/0186099 A1 | 7/2015 | Hall | |
| 2015/0317952 A1 | 11/2015 | Ohara et al. | |
| 2018/0122312 A1 | 5/2018 | Niu et al. | |
| 2019/0156740 A1 | 5/2019 | Xu | |
| 2020/0394953 A1* | 12/2020 | Kim | H05B 45/33 |

FOREIGN PATENT DOCUMENTS

| | | |
|---|---|---|
| CN | 104752468 A | 7/2015 |
| CN | 106297642 A | 1/2017 |
| CN | 107248391 A | 10/2017 |
| CN | 107658326 A | 2/2018 |
| CN | 109065592 A | 12/2018 |
| CN | 110579920 A | 12/2019 |
| CN | 111243497 A | 6/2020 |
| JP | 2006-139058 A | 6/2006 |

OTHER PUBLICATIONS

International Search Report for PCT/CN2021/074224 Mailed Mar. 24, 2021.
Office Action dated Dec. 16, 2020 for Chinese Patent Application No. 202010167215.8 and English Translation.
Office Action dated May 7, 2021 for Chinese Patent Application No. 202010167215.8 and English Translation.

* cited by examiner

PIXEL STRUCTURE, DISPLAY PANEL, AND DISPLAY DEVICE

CROSS-REFERENCE TO RELATED APPLICATIONS

The present application is a U.S. National Phase Entry of International Application No. PCT/CN2021/074224 having an international filing date of Jan. 28, 2021, which claims priority to Chinese patent application No. 202010167215.8, filed to CNIPA on Mar. 11, 2020 and entitled "Pixel Structure, Display Panel, and Display Device". The entire contents of the above-identified applications are hereby incorporated by reference.

TECHNICAL FIELD

Embodiments of the present disclosure relate, but are not limited, to the technical field of display, and particularly to a pixel structure, a display panel, and a display device.

BACKGROUND

Under display architectures of some display products, positive and negative electrodes of Light-Emitting Diodes (LEDs) are usually connected by row and column tube channels, row tubes are multiplexed through a multiplexer (mux) to reduce the number of used Integrated Circuits (ICs), and sub-pixels are turned on by timing control over turning-on and turning-off of the row tubes and output of column tubes. Under such an architecture, one or even more Printed Circuit Boards (PCBs) may usually be used to place driving ICs, and positive and negative electrodes of almost all LEDs of a display panel are led out to the PCB, so a requirement on a glass edge lead process is relatively high, the process cost is relatively high, and the module thickness is relatively large.

SUMMARY

The below is a summary about the subject matter described in the present disclosure in detail. The summary is not intended to limit the scope of protection of the claims.

The embodiments of the present disclosure provide a pixel structure, a display panel, and a display device.

According to a first aspect, the embodiments of the present disclosure provide a pixel structure, which includes three sub-pixel units of different colors and a driving unit. The three sub-pixel units include a first sub-pixel unit, a second sub-pixel unit, and a third sub-pixel unit. The driving unit is configured to send corresponding display data to the three sub-pixel units respectively.

The sub-pixel units are arranged on one side or two sides of the driving unit.

In some embodiments, the pixel structure is arranged in two rows: a first row is the three sub-pixel units arranged abreast, and the other row is the driving unit; or, the pixel structure is arranged in two columns: a first column is the three sub-pixel units arranged abreast, and the other column is the driving unit.

In some embodiments, the pixel structure is arranged in one row: the three sub-pixel units and the driving unit are arranged abreast in the same row or the same column.

In some embodiments, the pixel structure is arranged in three rows. Herein, the first sub-pixel unit and the third sub-pixel unit are abreast in a first row, the driving unit is in a second row, and the second sub-pixel unit is in a third row.

Or, the pixel structure is arranged in three columns. Herein, the first sub-pixel unit and the third sub-pixel unit are abreast in a first column, the driving unit is in a second column, and the second sub-pixel unit is in a third column.

In some embodiments, the sub-pixel units are on two adjacent sides of the driving unit. Herein, the first sub-pixel unit and the third sub-pixel unit are at diagonal positions of the pixel structure, and the second sub-pixel unit and the driving unit are at other diagonal positions of the pixel structure.

According to a second aspect, a display panel is provided, which includes multiple pixel structures provided in one or more abovementioned embodiments arranged in an array.

In some embodiments, when the pixel structure is arranged in three rows, in every two columns of pixel structures, the pixel structure in a second column is obtained by turning the pixel structure in a first column upside down; or when the pixel structure is arranged in three columns, in every two rows of pixel structures, the pixel structure in a second row is obtained by turning the front and back of the pixel structure in a first row.

In some embodiments, when the sub-pixel units are on two adjacent sides of the driving unit, in every two columns of pixel structures, the pixel structure in a second column is obtained by rotating the pixel structure in a first column by 180°.

In some embodiments, when the sub-pixel units are on the two adjacent sides of the driving unit, in every two columns of pixel structures, the pixel structure in a second column is obtained by turning the pixel structure in a first column upside down.

According to a third aspect, the embodiments of the present disclosure provide a display device, which includes the display panel provided in one or more abovementioned embodiments.

After the drawings and the detailed descriptions are read and understood, the other aspects may be comprehended.

BRIEF DESCRIPTION OF DRAWINGS

After the detailed descriptions made to nonrestrictive embodiments with reference to the following drawings are read, the other features, objectives, and advantages of the present disclosure will be clearer.

DETAILED DESCRIPTION

The present disclosure will be described below in combination with the drawings and the embodiments in detail. It can be understood that the exemplary embodiments described here are adopted not to limit the present disclosure but only to explain the present disclosure. In addition, for ease of description, only parts related to the present disclosure are shown in the drawings.

Unless otherwise defined, technical terms or scientific terms used in the present disclosure should have the same meanings as commonly understood by those of ordinary skill in the art the present disclosure belongs thereto. "First", "second", and similar terms used in the present disclosure do not represent any sequence, number, or significance but are only adopted to distinguish different components. "Include", "contain", or a similar term means that an element or object appearing before the term covers an element or object and equivalent thereof listed after the term and does not exclude other elements or objects. "Connect", "mutually connected", or similar terms are not limited to physical or mechanical connection but may include electrical connection, either direct or indirect. "Upper", "lower", "left", "right", etc., are used to represent relative positional relationships, and when an absolute position of a described object is changed, the relative positional relationship may also be correspondingly changed.

"Abreast" used in the embodiments of the present disclosure refers to arrangement on the same line (row or column) in a random order.

The embodiments in the present disclosure and the features in the embodiments can be combined without conflicts. The technical solutions of the present disclosure will be described below in detail with reference to the drawings and in combination with the embodiments.

Figure 1:
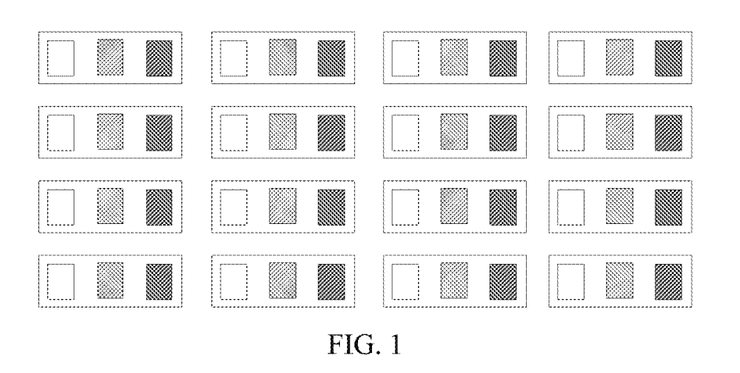
FIG. 1 is a structural schematic diagram of a pixel structure.
Figure 2:
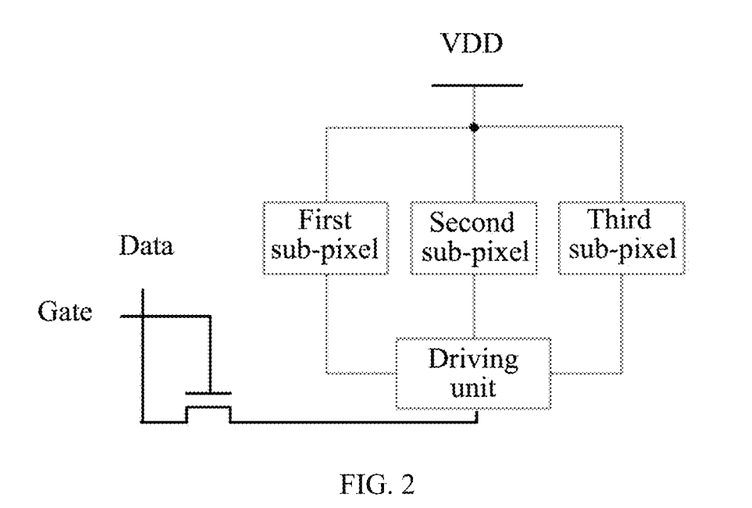
FIG. 2 is a structural schematic diagram of a pixel driving circuit of a hybrid driving mode.

In some display products, in addition to LEDs packaged in a four-in-one manner, monochromatic Red Green Blue (RGB) LEDs are adopted for sub-pixel arrangement, and a sub-pixel arrangement is relatively simple, as shown in FIG. 1. For example, under a display architecture of a Mini LED display product, positive and negative electrodes of LEDs are connected by row and column tube channels, row tubes are multiplexed through a mux to reduce the number of used ICs, and sub-pixels are turned on by timing control over turning-on and turning-off of the row tubes and output of column tubes. Under such an architecture, one or even more PCBs may usually be used to place driving ICs, and positive and negative electrodes of almost all LEDs of a display panel are led out to the PCB, so a requirement on a glass edge lead process is relatively high, the process cost is increased, and the module thickness is increased. Therefore, there emerges a hybrid driving architecture combining LEDs and pixel chips. As shown in FIG. 2, a pixel structure may include multiple sub-pixel units, and may also include a driving unit, and the driving unit is electrically connected with each sub-pixel unit, and writes a corresponding display signal Data into the corresponding sub-pixel unit under the action of a scanning signal Gate. A Thin Film Transistor (TFT) driven by a pixel in a hybrid driving mode may be directly designed on a glass substrate, while the driving unit may occupy a certain space of the pixel, and thus may be rearranged with sub-pixels.

The present disclosure provides pixel structures, display panels, and display devices in the following hybrid driving modes.

Referring to FIG. 3, FIG. 5, FIG. 7, FIG. 9, FIG. 11, FIG. 13, and FIG. 15, the embodiments of the present disclosure provide a pixel structure. The pixel structure includes three sub-pixel units of different colors and a driving unit 10. The three sub-pixel units include a first sub-pixel unit 21, a second sub-pixel unit 22, and a third sub-pixel unit 23. The driving unit is configured to send corresponding display data to each sub-pixel unit. The three sub-pixel units are arranged on one side or two sides of the driving unit 10. As such, a hybrid pixel structure combining sub-pixels and the driving unit is applied to a display product, a sub-pixel arrangement and pixel array thereof may be regulated flexibly according to different driving manners, simplicity for wiring is achieved, a process requirement is relatively low, the process cost is reduced, and the module thickness is reduced.

Herein, the colors of the three sub-pixel units may be red, green, and blue. Alternatively, another color assortment may be adopted.

In an exemplary embodiment, when the three sub-pixel units are arranged on one side of the driving unit 10, the pixel structures in FIG. 3, FIG. 5, FIG. 7, and FIG. 9 may be adopted.

Figure 3:
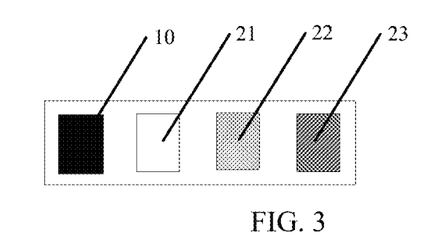
FIG. 3 is a first structural schematic diagram of a pixel structure according to an embodiment of the present disclosure.

In an exemplary embodiment, as shown in FIG. 3, the pixel structure may be arranged in one row: the three sub-pixel units and the driving unit 10 are arranged abreast in the same row. Here, in FIG. 3, abreast arrangement of the first sub-pixel unit 21, the second sub-pixel unit 22, and the third sub-pixel unit 23 on a right side of the driving unit 10 is illustrated as an example. For example, taking using a color assortment of red, green, and blue for the three sub-pixel units as an example, the first sub-pixel unit 21 may be red, the second sub-pixel unit 22 may be green, and the third sub-pixel unit 23 may be blue. A corresponding relationship between a color and a sub-pixel unit may be matched as required, and no limits are made here. In another exemplary embodiment, the first sub-pixel unit 21, the second sub-pixel unit 22, and the third sub-pixel unit 23 may be arranged abreast on a left side of the driving unit 10, namely the driving unit 10 is arranged on a rightmost side.

Figure 5:
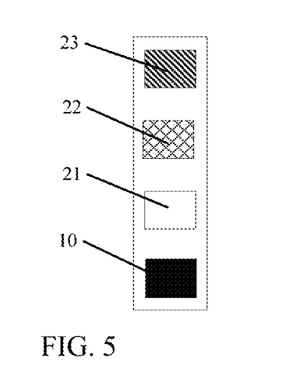
FIG. 5 is a second structural schematic diagram of a pixel structure according to an embodiment of the present disclosure.

In an exemplary embodiment, as shown in FIG. 5, the pixel structure may be arranged in one column: the three sub-pixel units and the driving unit 10 are arranged abreast in the same column. Here, in FIG. 3, abreast arrangement of the first sub-pixel unit 21, the second sub-pixel unit 22, and the third sub-pixel unit 23 on an upper side of the driving unit 10 is illustrated as an example. In another exemplary embodiment, the first sub-pixel unit 21, the second sub-pixel unit 22, and the third sub-pixel unit 23 may be arranged abreast on a lower side of the driving unit 10, namely the driving unit 10 is arranged on an uppermost side.

Figure 4:
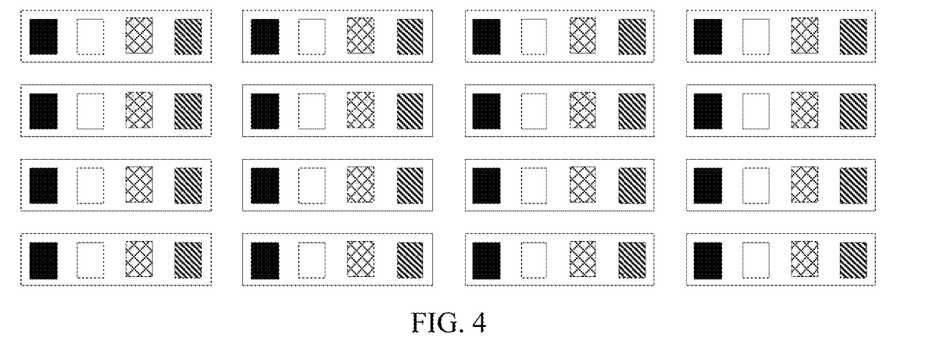
FIG. 4 is a structural schematic diagram of a display panel based on a pixel structure in FIG. 3 according to an embodiment of the present disclosure.

In an exemplary embodiment, FIG. 4 is a structural schematic diagram of a display panel including pixel structures shown in FIG. 3 arranged in an array according to an embodiment of the present disclosure. As shown in FIG. 3 and FIG. 4, the display panel may include multiple pixel structures arranged in an array, and the three sub-pixel units and driving unit in each pixel structure are deployed along a row direction of an array. Herein, in each pixel structure, the driving unit 10 is on a leftmost side of the pixel structure, and the first sub-pixel unit 21, the second sub-pixel unit 22, and the third sub-pixel unit 23 are arranged abreast on a right side of the driving unit 10. In another exemplary embodiment, the display panel may adopt such a structure that the driving unit 10 is on a rightmost side of the pixel structure.

Figure 6:
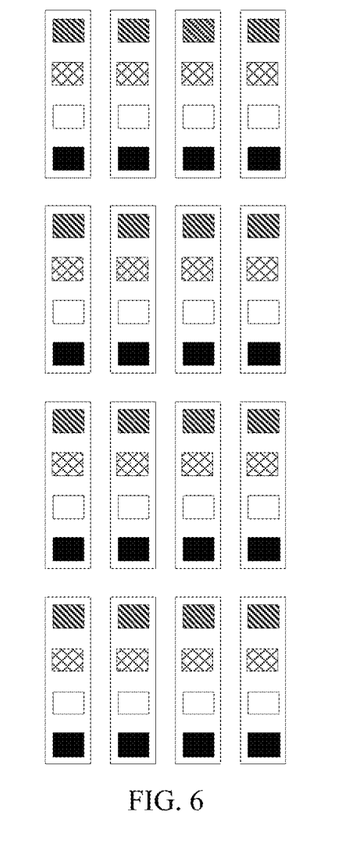
FIG. 6 is a structural schematic diagram of a display panel based on a pixel structure in FIG. 5 according to an embodiment of the present disclosure.

In an exemplary embodiment, FIG. 6 is a structural schematic diagram of a display panel including pixel structures shown in FIG. 5 arranged in an array according to an embodiment of the present disclosure. As shown in FIG. 5 and FIG. 6, the display panel may include multiple pixel structures arranged in an array, and the three sub-pixel units and driving unit in each pixel structure are deployed along a column direction of an array. Herein, in each pixel structure, the driving unit 10 is at a lowermost end of the pixel structure, and the first sub-pixel unit 21, the second sub-pixel unit 22, and the third sub-pixel unit 23 are arranged abreast on an upper side of the driving unit 10. In another exemplary embodiment, the display panel may adopt such a structure that the driving unit 10 is on an uppermost side of the pixel structure.

Here, FIG. 4 and FIG. 6 only show exemplary implementation modes of the display panel adopting the pixel structures shown in FIG. 3 and FIG. 5, and the display panel provided in the embodiments of the present disclosure includes, but not limited to, the abovementioned modes. For example, the first sub-pixel unit 21, second sub-pixel unit 22, and third sub-pixel unit 23 in the display panels shown in FIG. 4 and FIG. 6 may be transposed, and no limits are made here.

Figure 7:
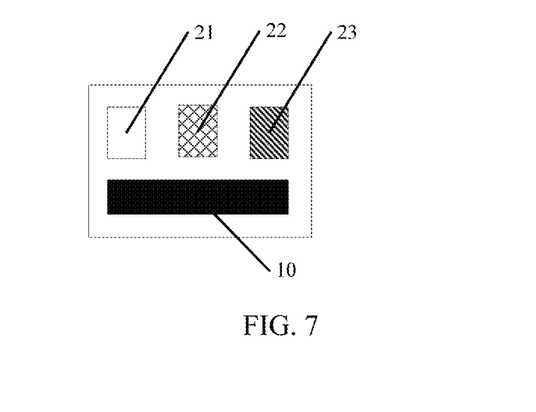
FIG. 7 is a third structural schematic diagram of a pixel structure according to an embodiment of the present disclosure.

In an exemplary embodiment, as shown in FIG. 7, the pixel structure may be arranged in two rows: a first row is the three sub-pixel units arranged abreast, i.e., the first sub-pixel unit 21, second sub-pixel unit 22, and third sub-pixel unit 23 that are arranged abreast, and the other row is the driving unit 10. For example, the first sub-pixel unit 21 may be red, the second sub-pixel unit 22 may be green, and the third sub-pixel unit 23 may be blue. Here, a corresponding relationship between a color and a sub-pixel unit may be matched as required, and no limits are made thereto in the embodiments of the present disclosure. For example, like the pixel structure that the first row is the three sub-pixel units arranged abreast and a second row is the driving unit in FIG. 7, in practical applications, the pixel structure may be arranged in a manner that the first row is the driving unit and the second row is the three sub-pixel units arranged abreast. For example, the three sub-pixel units in the pixel structure shown in FIG. 7 may be transposed, and no limits are made here.

Figure 9:
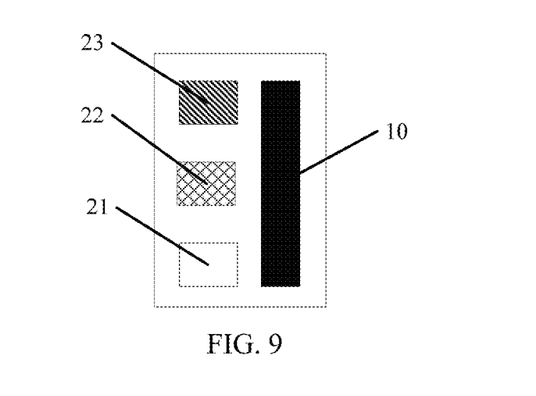
FIG. 9 is a fourth structural schematic diagram of a pixel structure according to an embodiment of the present disclosure.

In an exemplary embodiment, as shown in FIG. 9, the pixel structure may be arranged in two columns: a first column is the three sub-pixel units arranged abreast, i.e., the first sub-pixel unit 21, second sub-pixel unit 22, and third sub-pixel unit 23 that are arranged abreast, and the other column is the driving unit 10. For example, in practical applications, the pixel structure may be arranged in a manner that the first column is the driving unit and a second column is the sub-pixel units arranged abreast. For example, the three sub-pixel units in the pixel structure shown in FIG. 9 may be transposed, and no limits are made here.

Figure 8:
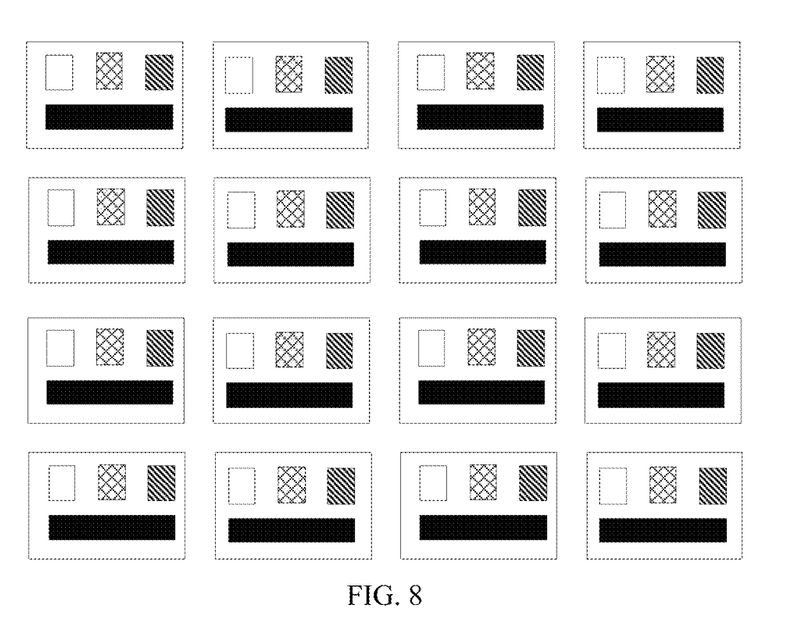
FIG. 8 is a structural schematic diagram of a display panel based on a pixel structure in FIG. 7 according to an embodiment of the present disclosure.

In an exemplary embodiment, FIG. 8 is a structural schematic diagram of a display panel including pixel structures shown in FIG. 7 arranged in an array according to an embodiment of the present disclosure. As shown in FIG. 7 and FIG. 8, the display panel may include multiple pixel structures arranged in an array. In each pixel structure, the three sub-pixel units are deployed along a row direction of an array, and the driving unit 10 is below the three sub-pixel units. In another exemplary embodiment, the display panel may adopt such a structure that the driving unit 10 is above the three sub-pixel units.

Figure 10:
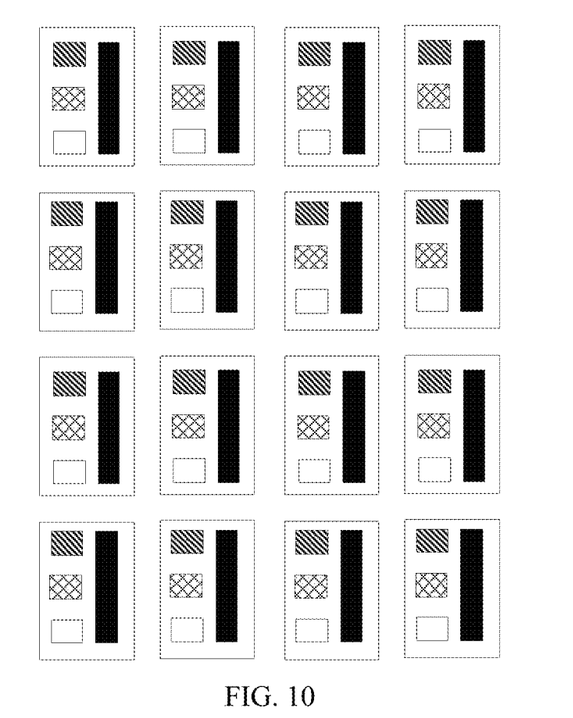
FIG. 10 is a structural schematic diagram of a display panel based on a pixel structure in FIG. 9 according to an embodiment of the present disclosure.

In an exemplary embodiment, FIG. 10 is a structural schematic diagram of a display panel including pixel structures shown in FIG. 9 arranged in an array according to an embodiment of the present disclosure. As shown in FIG. 9 and FIG. 10, the display panel may include multiple pixel structures arranged in an array. In each pixel structure, the three sub-pixel units are deployed along a column direction of an array, and the driving unit 10 is on a right side of the three sub-pixel units. In another exemplary embodiment, the display panel may adopt such a structure that the driving unit 10 is on a left side of the three sub-pixel units. As such, the display panel in FIG. 10 may solve the problem of color cast in a large field of view.

Here, FIG. 8 and FIG. 10 only show exemplary implementation modes of the display panel adopting the pixel structures shown in FIG. 7 and FIG. 9, and the display panel provided in the embodiments of the present disclosure includes, but not limited to, the abovementioned modes. For example, the first sub-pixel unit 21, second sub-pixel unit 22, and third sub-pixel unit 23 in the display panels shown in FIG. 8 and FIG. 10 may be transposed, and no limits are made here.

Figure 11:
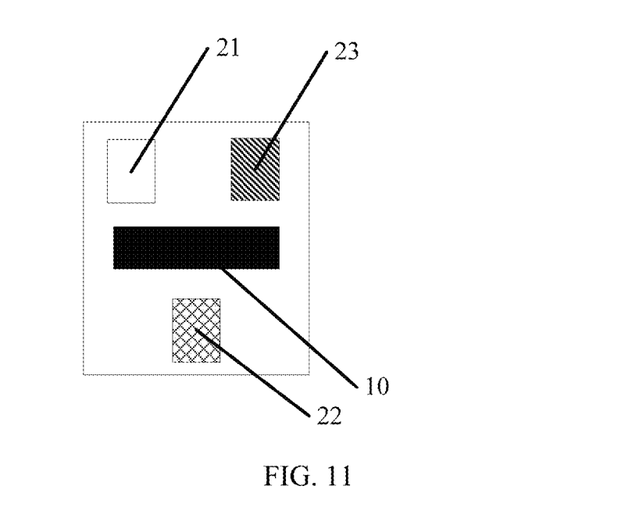
FIG. 11 is a fifth structural schematic diagram of a pixel structure according to an embodiment of the present disclosure.

In some embodiments, the pixel structure may be arranged in three rows, for example, as shown in FIG. 11. Herein, the first sub-pixel unit 21 and the third sub-pixel unit 23 are abreast in a first row, the driving unit is in a second row, and the second sub-pixel unit 22 is in a third row. Alternatively, the second sub-pixel unit 22 and the third sub-pixel unit 23 may be arranged in the first row, and the first sub-pixel unit 21 may be arranged in the third row. Here, which sub-pixel units are arranged in the first row and the third row is not limited as long as a triangular shape is formed by arranging any two of the three sub-pixel units in the first row and arranging the other in the third row.

Figure 13:
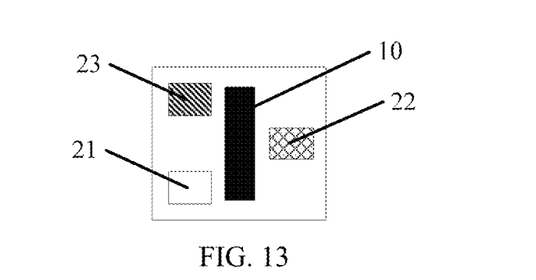
FIG. 13 is a sixth structural schematic diagram of a pixel structure according to an embodiment of the present disclosure.

In an exemplary embodiment, as shown in FIG. 13, the pixel structure may be arranged in three columns. Herein, the first sub-pixel unit 21 and the third sub-pixel unit 23 are abreast in a first column, the driving unit is in a second column, and the second sub-pixel unit 22 is in a third column. Alternatively, the second sub-pixel unit 22 and the third sub-pixel unit 23 may be arranged in the first column, and the first sub-pixel unit 21 may be arranged in the third column. Here, the column where each sub-pixel unit is located is not limited. Any two of the three sub-pixel units are arranged in the first column, and the other is arranged in the third column.

Figure 12:
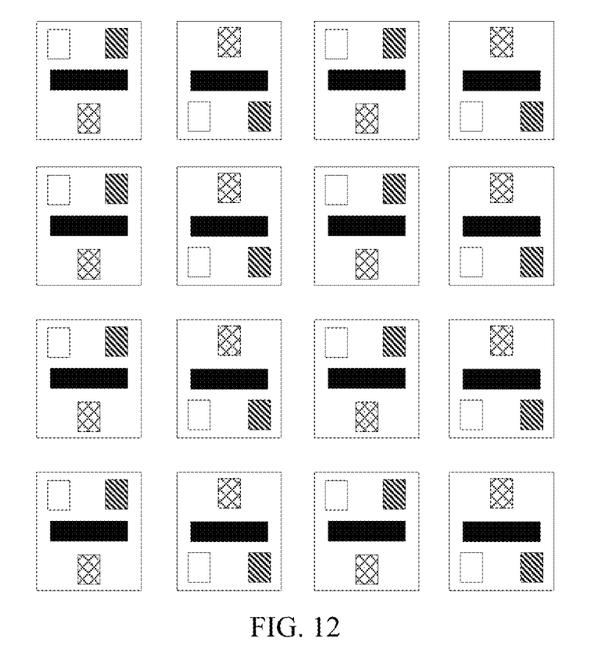
FIG. 12 is a structural schematic diagram of a display panel based on a pixel structure in FIG. 11 according to an embodiment of the present disclosure.

In an exemplary embodiment, FIG. 12 is a structural schematic diagram of a display panel including pixel structures in FIG. 11 arranged in an array according to an embodiment of the present disclosure. As shown in FIG. 11 and FIG. 12, the display panel may include multiple pixel structures arranged in an array, each pixel structure may be arranged in three rows, and in every two columns of pixel structures, the pixel structure in a second column is obtained by turning the pixel structure in a first column upside down (vertical turning). Herein, the pixel structure in the first column forms an inverted triangle. In the pixel structure in the first column, the first sub-pixel unit 21 and the third sub-pixel unit 23 are in the first row, the driving unit 10 is in the second row, and the second sub-pixel unit 22 is in the third row. The pixel structure in the second column forms a normal triangle. In the pixel structure in the second column, the second sub-pixel unit 22 is in the first row, the driving unit 10 is in the second row, and the first sub-pixel unit 21 and the third sub-pixel unit 23 are in the third row. As such, multiple colors are uniformly distributed non-adjacent to one another in the display panel. Here, FIG. 12 only shows an exemplary implementation mode of the display panel adopting the pixel structure shown in FIG. 11. The display panel is not limited to the abovementioned mode. Herein, the first sub-pixel unit 21, second sub-pixel unit 22, and third sub-pixel unit 23 may be transposed, and no limits are made here.

Figure 14:
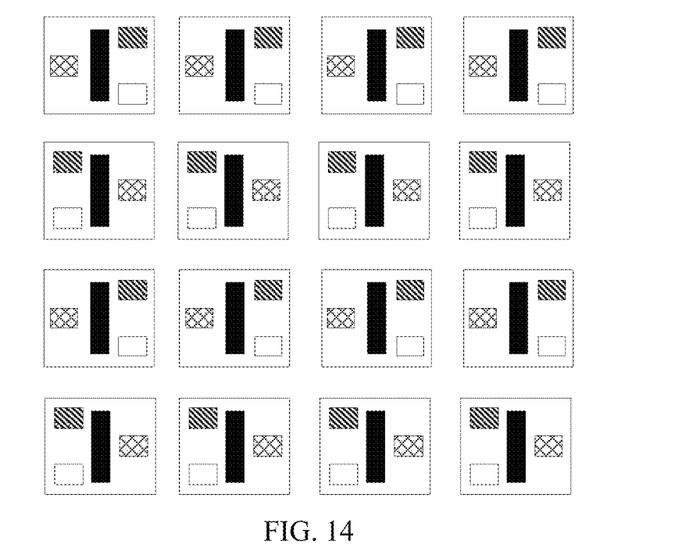
FIG. 14 is a structural schematic diagram of a display panel based on a pixel structure in FIG. 13 according to an embodiment of the present disclosure.

In an exemplary embodiment, FIG. 14 is a structural schematic diagram of a display panel including pixel structures in FIG. 13 arranged in an array according to an embodiment of the present disclosure. As shown in FIG. 13 and FIG. 14, the display panel may include multiple pixel structures arranged in an array, each pixel structure may be arranged in three columns, and in every two rows of pixel structures, the pixel structure in a second row is obtained by turning the front and back of the pixel structure in the first row (horizontal turning). Herein, in the pixel structure in the first row, the second sub-pixel unit 22 is in the first column, the driving unit 10 is in the second column, and the first sub-pixel unit 21 and the third sub-pixel unit 23 are in the third column. In the pixel structure in the second row, the first sub-pixel unit 21 and the third sub-pixel unit 23 are in the first column, the driving unit 10 is in the second column, and the second sub-pixel unit 22 is in the third column. As such, multiple colors may be uniformly distributed non-adjacent to one another in the display panel. Here, FIG. 14 only shows an exemplary implementation mode of the display panel adopting the pixel structure shown in FIG. 13. The display panel is not limited to the abovementioned mode. Herein, the first sub-pixel unit 21, second sub-pixel unit 22, and third sub-pixel unit 23 may be transposed, and no limits are made here.

Figure 15:
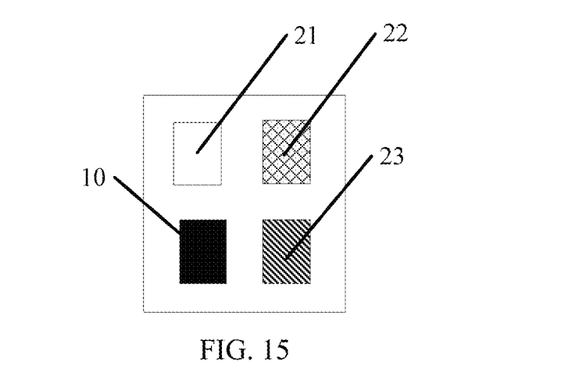
FIG. 15 is a seventh structural schematic diagram of a pixel structure according to an embodiment of the present disclosure.

In some embodiments, the pixel structure may adopt a structure shown in FIG. 15. As shown in FIG. 15, the pixel structure includes three sub-pixel units and a driving unit 10. The three sub-pixel units include a first sub-pixel unit 21, second sub-pixel unit 22, and third sub-pixel unit 23 of different colors. The sub-pixel units may be on two adjacent sides of the driving unit. For example, they may be as follows: any two sub-pixel units are adjacent to two adjacent sides of the driving unit, the other sub-pixel unit is at a diagonal position of the driving unit, and the three sub-pixel units enclose the driving unit. Herein, the first sub-pixel unit 21 and the third sub-pixel unit 23 are at diagonal positions of the pixel structure, and the second sub-pixel unit 22 and the driving unit 10 are at other diagonal positions of the pixel structure. As such, the pixel structure fully utilizes the space, and is compact in structure and suitable for use in a high-resolution application scenario. Here, in FIG. 15, the pixel structure is illustrated taking the condition that a left top corner of the pixel structure is the first sub-pixel unit 21, a right top corner is the second sub-pixel unit 22, a left bottom corner is the driving unit 10, and a right bottom corner is the third sub-pixel unit 23 as an example. Herein, the diagonal positions of the abovementioned three sub-pixel units and driving unit 10 may be interchanged, and no limits are made here. For example, the left top corner of the pixel structure is the second sub-pixel unit 22, the right top corner is the first sub-pixel unit 21, the left bottom corner is the third sub-pixel unit 23, and the right bottom corner is the driving unit 10. For example, the first sub-pixel unit 21 may be red, the second sub-pixel unit 22 may be green, and the third sub-pixel unit 23 may be blue. A corresponding relationship between a color and a sub-pixel unit may be matched as required, and no limits are made here.

Figure 16:
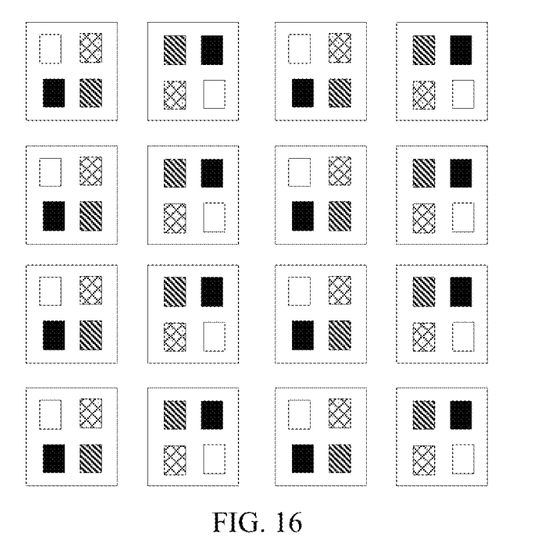
FIG. 16 is a structural schematic diagram of a display panel based on a pixel structure in FIG. 15 according to an embodiment of the present disclosure.

In an exemplary embodiment, FIG. 16 is a structural schematic diagram of a display panel including pixel structures in FIG. 15 arranged in an array according to an embodiment of the present disclosure. As shown in FIG. 16, the display panel may include multiple pixel structures arranged in an array. When the sub-pixel units in each pixel structure are on two adjacent sides of the driving unit, in every two columns of pixel structures, the pixel structure in a second column is obtained by rotating the pixel structure in a first column by 180°. A left top corner of the pixel structure in the first column is the first sub-pixel unit 21, a right top corner is the second sub-pixel unit 22, a left bottom corner is the driving unit 10, and a right bottom corner is the third sub-pixel unit 23. A left top corner of the pixel structure in the second column is the third sub-pixel unit 23, a right top corner is the driving unit 10, a left bottom corner is the second sub-pixel unit 22, and right bottom corner is the first sub-pixel unit 21.

Figure 17:
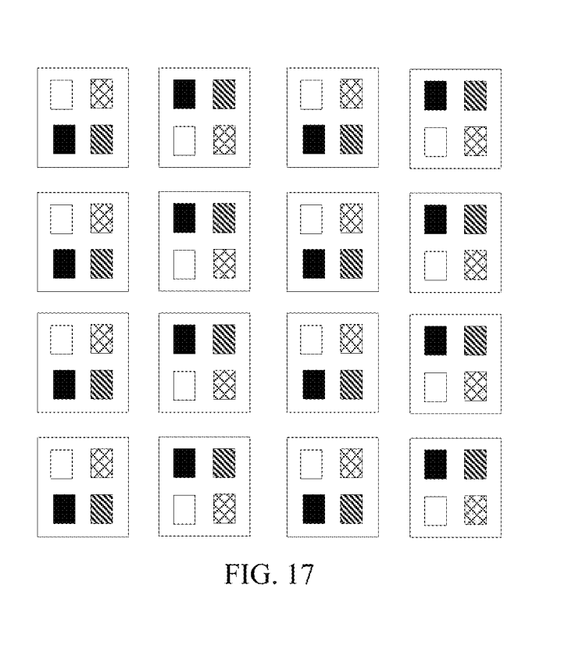
FIG. 17 is a structural schematic diagram of another display panel based on a pixel structure in FIG. 15 according to an embodiment of the present disclosure.

In an exemplary embodiment, FIG. 17 is a structural schematic diagram of another display panel including pixel structures in FIG. 15 arranged in an array according to an embodiment of the present disclosure. As shown in FIG. 17, the display panel may include multiple pixel structures arranged in an array. When the sub-pixel units in each pixel structure are on two adjacent sides of the driving unit, in every two columns of pixel structures, the pixel structure in a second column is obtained by turning the pixel structure in a first column upside down (vertical turning). Herein, a left top corner of the pixel structure in the first column is the first sub-pixel unit 21, a right top corner is the second sub-pixel unit 22, a left bottom corner is the driving unit 10, and a right bottom corner is the third sub-pixel unit 23. A left top corner of the pixel structure in the second column is the driving unit 10, a right top corner is the third sub-pixel unit 23, a left bottom corner is the first sub-pixel unit 21, and a right bottom corner is the second sub-pixel unit 22.

Here, FIG. 16 and FIG. 17 only show exemplary implementation modes of the display panel adopting the pixel structure shown in FIG. 15, and the display panel provided in the embodiments of the present disclosure includes, but not limited to, the abovementioned modes. For example, the diagonal positions of the sub-pixel units and driving unit in the display panels shown in FIG. 16 and FIG. 17 may be interchanged, and no limits are made here.

The embodiments of the present disclosure also provide a display device. The display device may include the display panel provided in one or more abovementioned embodiments.

The above description is only description about the exemplary embodiments of the present disclosure and adopted technical principles. Those skilled in the art should know that the scope of protection involved in the present disclosure is not limited to the technical solutions formed by specifically combining the abovementioned technical features and should also cover other technical solutions formed by freely combining the abovementioned technical features or equivalent features thereof without departing from the principle of the present disclosure, for example, technical solutions formed by mutually replacing the abovementioned features and (but not limited to) the technical features with similar functions disclosed in the present disclosure.

What is claimed is:

1. A pixel structure, comprising three sub-pixel units of different colors and a driving unit, wherein:

the three sub-pixel units comprise a first sub-pixel unit, a second sub-pixel unit, and a third sub-pixel unit; the driving unit is configured to send corresponding display data to the three sub-pixel units respectively;

the sub-pixel units are arranged on two sides of the driving unit;

in every two rows of pixel structures, the pixel structure in a second row is obtained by flipping the pixel structure in a first row pivoting on a side of the pixel structure in a column direction;

in the first row, the pixel structure is arranged in three columns, wherein the second sub-pixel unit is in a first column, the driving unit is in a second column, and the first sub-pixel unit and the third sub-pixel unit are in a third column in sequence;

in the second row, the pixel structure is arranged in three columns, wherein the first sub-pixel unit and the third sub-pixel unit are in a first column, the driving unit is in a second column, and the second sub-pixel unit is in a third column in sequence; and a distance between the second sub-pixel unit in the first column of the first row and the first sub-pixel unit in the first column of the second row is greater than a distance between the first sub-pixel unit and the third sub-pixel unit in the first column in the second row.

2. A display panel, comprising a plurality of pixel structures according to claim 1 arranged in an array.

3. A display device, comprising the display panel according to claim 2.

* * * * *